United States Patent
Nese et al.

(10) Patent No.: US 10,147,830 B2
(45) Date of Patent: Dec. 4, 2018

(54) METHOD FOR PRODUCTION OF WAFER BASED SOLAR PANELS

(71) Applicant: REC SOLAR PTE. LTD., Singapore (SG)

(72) Inventors: Martin Nese, Asker (NO); Erik Sauar, Oslo (NO); Andreas Bentzen, Oslo (NO); Paul Alan Basore, San Mateo, CA (US)

(73) Assignee: REC SOLAR PTE. LTD., Singapore (SG)

( * ) Notice: Subject to any disclaimer, the term of this patent is extended or adjusted under 35 U.S.C. 154(b) by 741 days.

(21) Appl. No.: 14/268,640

(22) Filed: May 2, 2014

(65) Prior Publication Data
US 2014/0238463 A1    Aug. 28, 2014

Related U.S. Application Data

(62) Division of application No. 12/937,959, filed as application No. PCT/NO2009/000130 on Apr. 2, 2009, now Pat. No. 8,753,957.
(Continued)

(30) Foreign Application Priority Data

Apr. 15, 2008  (GB) .................................. 0806850.4

(51) Int. Cl.
*H01L 31/042*     (2014.01)
*H01L 31/18*      (2006.01)
(Continued)

(52) U.S. Cl.
CPC .... *H01L 31/042* (2013.01); *H01L 31/022441* (2013.01); *H01L 31/0516* (2013.01);
(Continued)

(58) Field of Classification Search
CPC ........................... H01L 31/0422; H01L 31/05
(Continued)

(56) References Cited

U.S. PATENT DOCUMENTS 4,292,092 A  *  9/1981  Hanak .............................. 438/74
4,612,408 A     9/1986  Moddel et al.
(Continued)

FOREIGN PATENT DOCUMENTS

JP    S51-80789       7/1976
JP    52-108780 A     9/1977
(Continued)

OTHER PUBLICATIONS

Keevers et al., "10% Efficient CSG Minimodules," 22nd European Photovoltaic Solar Energy Conference, Milan, Sep. 2007 (8 pages).

*Primary Examiner* — Andres Munoz
(74) *Attorney, Agent, or Firm* — Birch, Stewart, Kolasch & Birch, LLP

(57) ABSTRACT

This invention relates to a method for producing solar cells, and photovoltaic panels thereof. The method for producing solar panels comprises employing a number of semiconductor wafers and/or semiconductor sheets of films prefabricated to prepare them for back side metallization, which are placed and attached adjacent to each other and with their front side facing downwards onto the back side of the front glass, before subsequent processing that includes depositing at least one metal layer covering the entire front glass including the back side of the attached wafers/sheets of films. The metallic layer is then patterned/divided into electrically isolated contacts for each solar cell and into interconnections between adjacent solar cells.

7 Claims, 7 Drawing Sheets

Side view of a section of an example embodiment of a solar panel according to the invention

Related U.S. Application Data

(60) Provisional application No. 61/045,164, filed on Apr. 15, 2008.

(51) Int. Cl.
 *H01L 31/0224* (2006.01)
 *H01L 31/05* (2014.01)

(52) U.S. Cl.
 CPC ........ *H01L 31/1804* (2013.01); *Y02E 10/547* (2013.01); *Y02P 70/521* (2015.11)

(58) Field of Classification Search
 USPC .... 257/433, 702, E31.11, E31.117, E25.004, 257/E25.007; 438/64, 66, 67, 68, 108, 438/118, 455, 458; 136/244, 251, 256
 See application file for complete search history.

(56) References Cited

U.S. PATENT DOCUMENTS

| | | | |
|---|---|---|---|
| 5,972,732 A | 10/1999 | Gee et al. | |
| 6,323,056 B1* | 11/2001 | Miyoshi | H01L 31/046 136/244 |
| 6,337,283 B1 | 1/2002 | Verlinden et al. | |
| 6,518,596 B1 | 2/2003 | Basore | |
| 6,890,838 B2 | 5/2005 | Henley et al. | |
| 7,095,050 B2* | 8/2006 | Wanlass | H01L 27/153 257/104 |
| 7,148,119 B1 | 12/2006 | Sakaguchi et al. | |
| 8,735,202 B2* | 5/2014 | Wanlass | H01L 31/06875 257/E31.033 |
| 2002/0185171 A1* | 12/2002 | Huang et al. | 136/258 |
| 2004/0261834 A1* | 12/2004 | Basore et al. | 136/244 |
| 2007/0079866 A1* | 4/2007 | Borden | H01L 31/046 136/252 |
| 2007/0144578 A1 | 6/2007 | Cunningham et al. | |
| 2007/0227578 A1 | 10/2007 | Perozziello et al. | |
| 2007/0240759 A1 | 10/2007 | Borden | |
| 2007/0277875 A1 | 12/2007 | Gadkaree et al. | |
| 2008/0072953 A1 | 3/2008 | Stephens et al. | |
| 2008/0105303 A1* | 5/2008 | Oswald | B23K 26/03 136/261 |
| 2008/0196756 A1* | 8/2008 | Basol | 136/244 |
| 2009/0159111 A1* | 6/2009 | Jawarani et al. | 136/244 |
| 2011/0126886 A1* | 6/2011 | Stangl | H01L 27/1423 136/249 |

FOREIGN PATENT DOCUMENTS

| | | |
|---|---|---|
| JP | 59-35489 A | 2/1984 |
| JP | H8-264817 A | 10/1996 |
| JP | H10-335683 A | 12/1998 |

\* cited by examiner

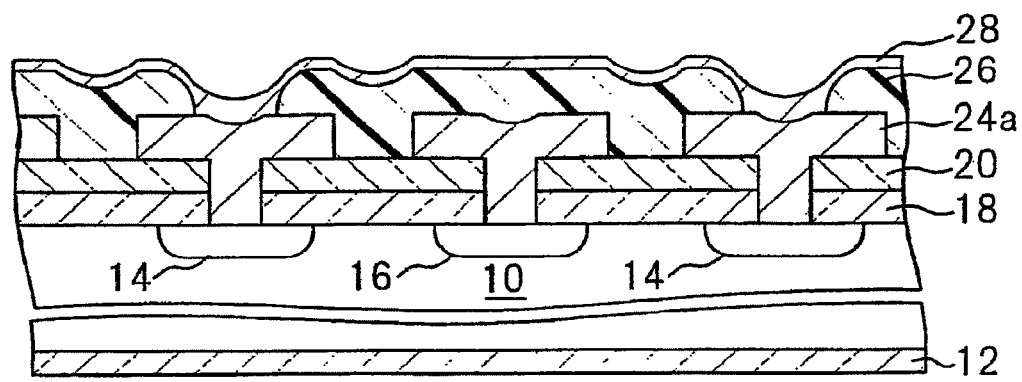
Figure 1  Example of prior art metallization of wafer a)
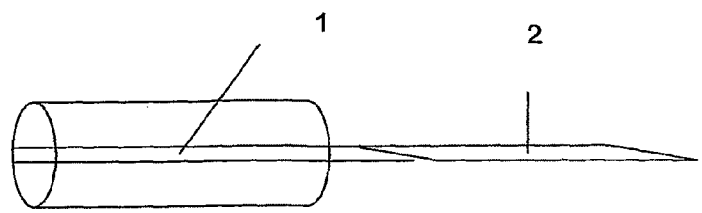
b)
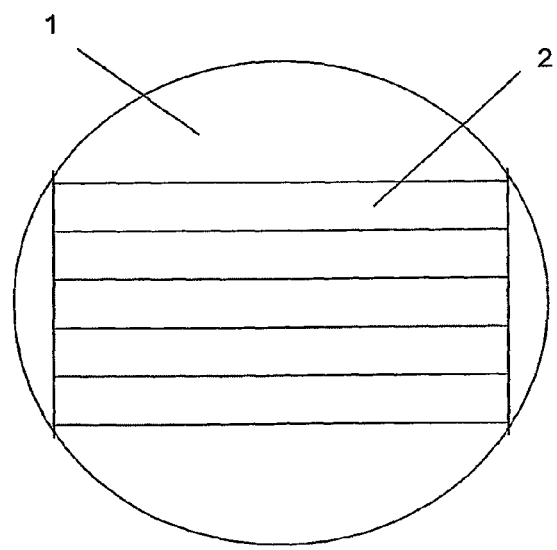
Figure 2  Example of cutting planes for making large donor substrates from a CZ-ingot

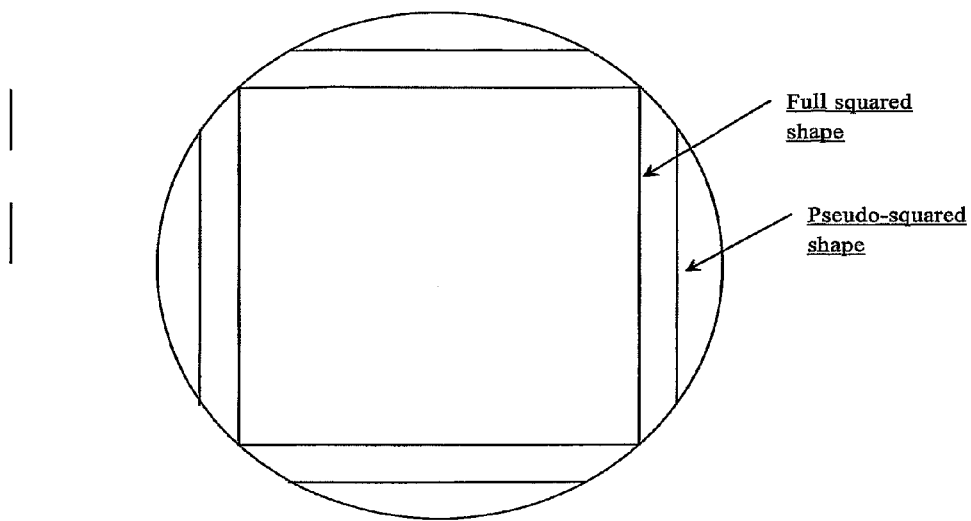
Figure 3 Example of cutting planes for semi-squaring and full-squaring a CZ-ingot

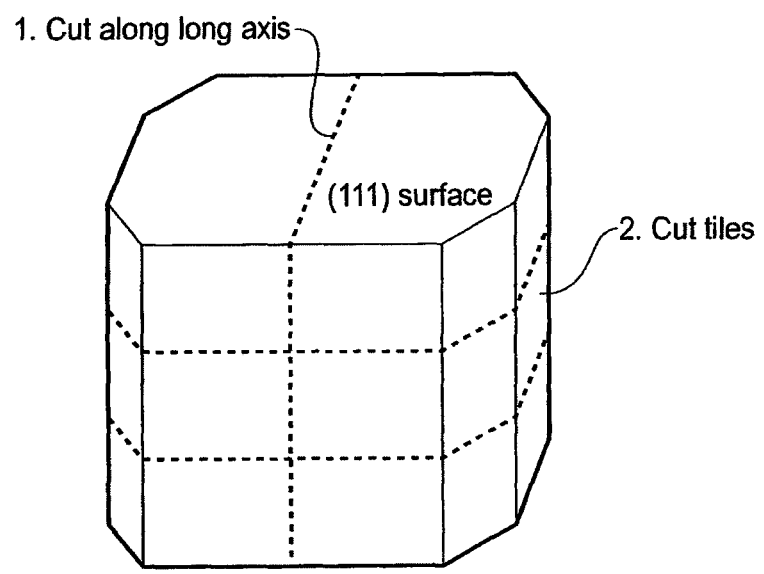
FIG. 4 Example of cutting planes for semi-squared CZ-ingot

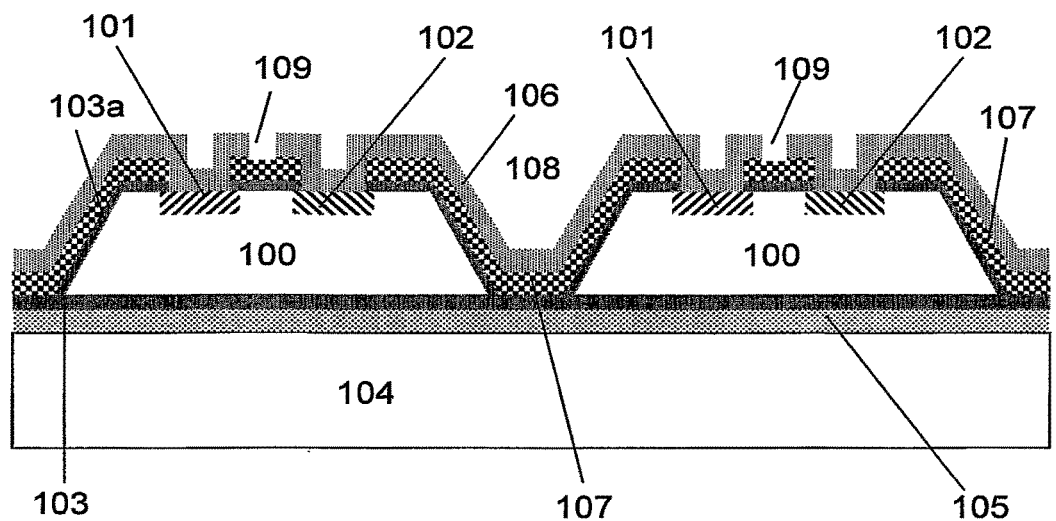
Figure 5 Side view of a section of an example embodiment of a solar panel according to the invention

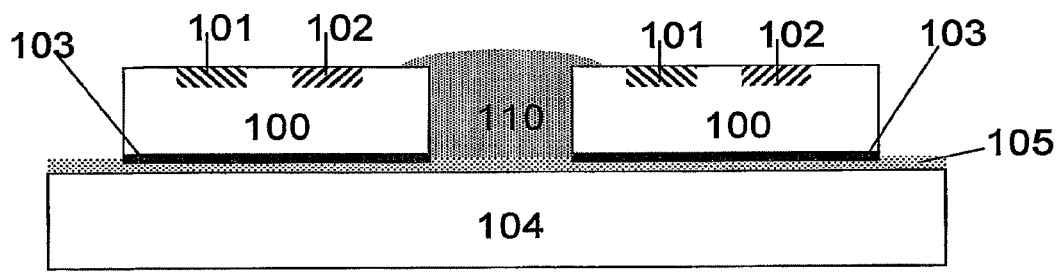
Figure 6 Example of planarizing method of the gap between adjacent wafers according to the invention

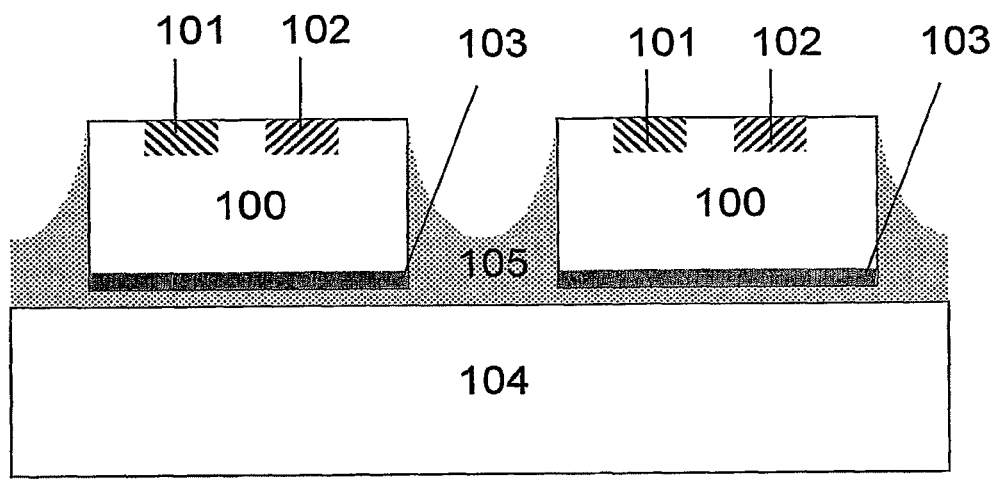
Figure 7 Another example of planarizing method of the gap between adjacent wafers according to the invention

METHOD FOR PRODUCTION OF WAFER BASED SOLAR PANELS

CROSS-REFERENCE TO RELATED APPLICATIONS

This application is a Divisional of copending U.S. application Ser. No. 12/937,959 filed on Dec. 28, 2010, which is the National Phase of PCT/NO2009/000130 filed on Apr. 2, 2009, which claims priority under 35 U.S.C. 119(e) to U.S. Provisional Application No. 61/045,164 filed on Apr. 15, 2008 and under 35 U.S.C. 119(a) to Patent Application No. 0806850.4 filed in United Kingdom on Apr. 15, 2008, all of which are hereby expressly incorporated by reference into the present application.

INTRODUCTION

The world supplies of fossil oil are expected to be gradually exhausted in the following decades. This means that our main energy source for the last century will have to be replaced within a few decades, both to cover the present energy consumption and the coming increase in the global energy demand.

In addition, there are raised many concerns that the use of fossil energy is increasing the earth greenhouse effect to an extent that may turn dangerous. Thus the present consumption of fossil fuels should preferably be replaced by energy sources/carriers that are renewable and sustainable for our climate and environment.

One such energy source is solar light, which irradiates the earth with vastly more energy than the present and any foreseeable increase in human energy consumption. However, solar cell electricity has up to date been too expensive to be competitive with nuclear power, thermal power etc. This needs to change if the vast potential of the solar cell electricity is to be realised.

The cost of electricity from a solar panel is a function of the energy conversion efficiency and the production costs of the solar panel. Thus the search for cheaper solar electricity should be focused at high-efficient solar cells made by cost-effective manufacturing methods.

The present invention is related to cost effective production methods of high efficient silicon based solar panels.

PRIOR ART

An efficient and cost effective method for making electric contacts suitable for back-contacted photovoltaic devices is to make the electric contacts by creating local openings in the passivation layer(s) on the back side of the wafer exposing the doped regions beneath, depositing a metallic layer on the entire back surface of the wafer covering the passivation layer(s) and the local openings, and then partitioning the metallic layer into electrically isolated metallic regions contacting the doped regions of the wafer.

An example of such technology is U.S. Pat. No. 6,337,283 which discloses a method for fabricating a back surface point contact silicon solar cell. The method comprises forming two passivation layers on the back surface of a silicon wafer having p-doped and n-doped regions, creating contact openings in the passivation layers at the p- and n-doped regions, depositing a first metal layer on the passivation layers in such a way that the first metal layer comes into contact with the p-doped regions and the n-doped regions, patterning the first metal layer in such a way that separate contacts for the p-doped and the n-doped regions are formed, depositing a first insulator layer on the first metal layer, creating contact openings in the insulating layer at either the first metal contacts of the p-doped or the n-doped regions, and finally depositing a second metal layer on the insulating layer to establish electric contact with the separate contacts for either the p-doped or the n-doped regions. The solar cell is illustrated in FIG. 1, where reference number 10 is the wafer, 12 is a passivation layer on the front surface, 14 are one type of doped regions, 16 is the other type of doped regions, 18 and 20 are two passivation layers on the back side of the wafer, 24a is the first metal layer after patterning, 26 is the insulator layer after patterning, and 28 is the second metal layer connecting the first metal contacts 24a in contact with the one type doped regions 14 if the wafer 10. The manufacturing method is applied for each cell individually.

Methods for contacting doped regions on silicon wafers which includes depositing a metal layer on an entire surface of the wafer will induce mechanical strains in the cell due to differences in the coefficient of thermal expansion of the silicon wafer and the metal layer. This mechanical stress causes only minor problems for present day wafers with thickness of typically 140-180 µm, since such thick wafers have the necessary mechanical strength to avoid significant buckling/deformation. However, for films and wafers with thickness below approx. 100 µm, this mechanical strain will create problems with unacceptable buckling/deformation and/or breakage of the cells.

However, for photovoltaic thin films deposited on glass substrates, there are known cost effective production methods where both the semiconductor film and a metallic layer serving as electric contacts are deposited directly on the glass substrate followed by partitioning to cells and electric contacts. One example of such technology is presented in US Appl. No. 2007/0227578, where a Mo-layer is first deposited on a glass substrate followed by a semiconductor layer of Cu(In, Ga)Se. Then the films are partitioned by use of laser scribing or chemical etching into a set of interconnected solar cells on the glass substrate. Another example of similar technology is known from U.S. Pat. No. 4,292,092.

In a recent article by Keevers et al. [1], there are disclosed a photovoltaic panel comprising a polycrystalline thin film of silicon deposited on a glass substrate (also known as crystalline silicon on glass, or CSG-technology). The article states that the manufacturing method is inherently cost effective, and has shown that solar panels with a record efficiency 10.4%. The manufacturing process begins with texturing one surface of the glass substrate by dip-coating with 0.5 µm silica beads. Then a layer if $SiN_x$ and a layer of p-doped amorphous silicon are deposited onto the textured surface by use of plasma enhanced chemical vapour deposition (PECVD). Then a thin film of polycrystalline silicon is formed by use of solid phase crystallisation followed by a rapid thermal treatment and rapid in-line hydrogenation. The deposited semiconductor layer is then partitioned to a set of individual cells by use of laser scribing, before a resin layer is applied by roller coating. Then a set of contact openings in the resin layer is formed by ink-jet printing an etching agent before the panel is finished by depositing an Al layer by sputtering followed by scribing to form the interconnects.

An other example of use of amorphous silicon films covered by a dielectric layer and a metal layer is shown in U.S. Pat. No. 6,518,596. This document shows the use of a silicon film covered with a silicon nitride film as a passivation layer, and where the contacting is obtained by forming local openings in the passivation by laser, followed by deposition of a metal layer for making contacts and finally partitioning the metal layer into separate contacts by use of laser scribing.

The limitation of CSG-technology is the relatively low photovoltaic conversion efficiency of about 10%. This is half of the conversion efficiency that is obtainable by use of monocrystalline silicon based solar cells.

OBJECTIVE OF THE INVENTION

The main objective of the invention is to provide a cost effective wafer based manufacturing method for solar panels which allows use of thin wafers of 100 µm or less, and which solves the problem with buckling/deformation and/or breakage of the cells.

The objective of the invention may be realised by the features as set forth in the description of the invention below, and/or in the appended patent claims.

DESCRIPTION OF THE INVENTION

The invention is based on the realisation that, from a cost perspective, the advantageous CSG-technology may be adapted to be used for wafer based solar cell production, and thus take advantage of the work load savings associated with the CGS-technology and the high conversion efficiencies obtainable by use of monocrystalline or polycrystalline wafers. That is, by employing semi-processed solar cells made from wafers which at least is made ready on their front side, the cell metallization and module interconnects may be combined in one metal process sequence similar to the CSG-technology when the more or less pre-fabricated wafers are attached to the transparent front glass of the solar panel/module. This feature will in addition to solving the problem of buckling/breakage of thin wafers with a deposited metal layer, also obtain significant cost and work load savings for producing solar cells and modules with the solar cell electric contacts on the back-side of the wafers by combining cell metallization and module/panel interconnection in one metal process.

Thus in one aspect, the present invention relates to a method for producing solar modules/panels, where the method comprises:
employing a number of semiconductor wafers which are pre-processed to a point where at least their front surface is made ready to be mounted onto a front glass of the solar panel/module, but which also may include one or more process steps for the back-side of the wafers up to, but not including, the metallization for forming electric contacts,
placing and attaching the intended number of the pre-processed wafers adjacent to each other and with their front side facing downwards onto the back side of the front glass,
depositing at least one metal layer or a stacked metal system covering the back side of the front glass including the back side of the pre-processed wafers, and
patterning/dividing the deposited metal layer(s) into at least one individual region forming the electrical contacts for each solar cell and the module interconnections between adjacent solar cells.

In a second aspect, the invention relates to solar panels/modules comprising:
a transparent front glass,
a number semiconductor wafers which each are processed to form semi-finished solar cells, and which are attached adjacent to each other onto the back side of the transparent front glass, and
where the electric contacts of the solar cells and the interconnects connecting adjacent solar cells of the solar panel/module are formed by at least one patterned metal layer covering the back side of the front glass including the back side of the attached semi-finished solar cells.

As used herein, the term "pre-processed to semi-finished solar cells made ready for back side metallization" means semiconductor wafers where the front side has been pre-processed to a finished solar cell state such that they may be attached to the front glass and thus constitute a functioning front side of the solar panel/module. This may include one or more of (but not limited to) the following process steps: surface texturing/damage etching, in-diffusion of doping elements, deposition of surface passivation films, deposition of anti-reflective coating, etc. The order of and choice of which process steps deemed necessary to form the front side of the solar cells, are obviously dependent upon which type solar cell that is being made. Typically, pre-processing of the wafers before attaching to the front glass includes high-temperature diffusion processes and passivation of the surface facing the front glass since this surface is not accessible after attachment to the front glass.

For the back side of the wafers, the term "pre-processed to semi-finished solar cells made ready for back side metallization" as used herein means that the back side of the wafers is processed to a semi-finished state that allows completion of the back side of all cells including metal interconnection after the wafers are attached to the front glass. That is, the only remaining process steps for forming an interconnected solar panel/module should be process steps that may be carried out at module level, that is carried out for all cells of the panel/module in one operation when they are attached to the front glass. This may be one or more of the following process steps: deposition and diffusion of doping elements, deposition and patterned etching of hetero junction contact layers, deposition of back-side reflective coating, deposition of back-side surface passivation layers, localised etching of passivation layers for forming contact openings to the doped regions of the underlying wafer, texturing, smoothing/planarizing of wafer edges, and the combined metallization and interconnection.

Thus in summary, the term "pre-processed to semi-finished solar cells made ready for back side metallization" means that the front surface of the wafers are processed to a finished solar cell state such that the wafers are ready to be attached to the front glass of the module/panel. For the back side of the wafers, all process steps that cannot be employed when the wafers are attached to the front glass needs to be performed. Typically this may be high temperature in-diffusion of dopants. However, the pre-processing of the back side of the wafers may include all process steps up to the deposition of the metal layer (metallization) which may be carried out when the wafers are attached to the front glass, this may be doping methods such as for instance depositing a highly doped amorphous silicon layer, laser doping or ion implantation.

The invention is not tied to any specific type of solar cell, such that any conceivable combination of process steps to form semi-finished solar cells made ready for back side metallization are included in the inventive method. That is, the invention may apply any known and conceivable combination of passivation films, doping elements, anti-reflective coatings on the individual wafers, and the wafers may be made from any conceivable semiconductor material including but not limited to Si, Ge, InP, or GaAs. The same applies to the choice of production method for pre-processing; any conceivable or known process known to a skilled person for pre-processing the wafers to semi-finished solar cells made ready for back side metallization may be applied.

Similarly, the invention is not tied to use of one or a set of specified patterning of the deposited layer for forming the contacts and interconnects. Any conceivable and known pattern constituting contacts and interconnects may be employed as long as they may be formed on one operation when all the wafers of the solar panel/module are attached onto the transparent front substrate of the panel/module. It might be advantageous to smooth/planarize the edge portion of each wafer to avoid sharp corners or risk of suspending the metal interconnects, and thus avoid risk of breakage and/or short circuiting the interconnects. The edge smoothing or planarizing may be obtained by removing a part of the front side edge of the wafers, for instance by mechanical or laser grinding. Alternatively, the smoothing or planarizing may be obtained by depositing a suitable material along the wafer, or by filling up the space between adjacent wafers to form a more rounded off shape of the edge portion of each wafer. The filling of material may be obtained by conventional techniques such as spin-coat deposition, roller coating, ink-jet printing, mounting of prefabricated elements etc.

As used herein, the term "front side" denotes the side of the wafer that is facing the sun when the solar panel is in operation. The term "back side" is the opposite side of the front side of the wafer, and the term "back-contacted" means that all connectors are placed on the back side of the wafer. When applied for the front glass, the term "front side" means the side of the transparent front glass that will face the sun when the solar panel is in operation, and the term "back side" means the opposite side which receives the wafers and then the deposited metal layer(s).

After completing the metal contact and interconnection process on the back-side of the front glass, the front glass continues into a standard module process were the cells and interconnections on the back-side are sealed/protected from the environment by EVA and protective back-sheet (for instance Tedlar or glass) in a lamination process at elevated temperature in vacuum. Finally, the laminated module sandwich can be mechanically strengthened by a metal frame and electrically connected/protected by a diode junction box.

The term "front glass" as used herein means any type of transparent material that may form the front plate of the finished solar panel/module. That is, the front glass should have the necessary mechanical and thermal strength to withstand the strains associated with carrying the solar cells and the deposited metal layer(s), during production (deposition of the metal layers) and intended use of the solar panel/module. In addition the front glass should be highly transparent and have a low reflectance over most or all of the light frequencies associated with the cells' photovoltaic effect. The front glass may include an anti-reflective coating etc. Suitable materials are including, but not limited to, soda-lime glass of any composition, borosilicate glass, quartz, transparent polymeric solids, etc.

The term "wafer" as used herein includes any planar sheet/disc etc. of semiconductor material with thickness from about 20 µm and up to present maximum wafers thicknesses of 200-300 µm. Thus the term wafer also includes sheets/discs of semiconductor materials usually termed as thick films. However, the wafers employed for this invention may advantageously have a planar thickness from about 150 µm or lower as long as the semiconductor wafer has sufficient mechanical strength to be subject to the pre-processing to a semi-finished solar cell. A suited thickness is from 20 to 80 µm. The invention should be understood as a wafer based production up to the point where the wafers are sufficiently pre-processed to allow attachment to the front glass and execution of all remaining process steps at a module level. That is, the inventive method should be considered as a combination of conventional wafers production methods and the CSG-technology.

The wafers may advantageously be given a substantially rectangular or squared shape and laid side by side on the front glass with a gap dimension in the range from about 0.1 to 2 mm. The invention may employ any known or conceivable photovoltaic semiconductor material in the form of wafers. Examples of semiconductor materials include, but are not limited to Si, InP, Ge, GaAs, etc. The semiconductor materials may be monocrystalline, or multicrystalline.

The wafers may advantageously be attached to the front glass by use of transparent glue. Any known or conceivable glue may be applied. Examples include, but are not limited to, epoxy based, silicone based or sol-gel based glues which are deposited on the front glass at a thickness in the range 1 to 50 µm, preferably to a thickness ranging from 10 to 20 µm, by one of the following techniques; spin coating, spray coating, roller coating, hot-melt dispensing or ink-jet printing.

The wafers may advantageously be planarized, that is the sharp edges of the back side of the wafers may be smoothed, in order to reduce the probability of inducing breakages in the metal bridge formed by the deposited metal layer forming the electric contacts across adjacent wafers. The smoothing/planarizing of the back side wafer edges may be obtained by, but are not limited to, one of the following process steps: removing a part of the back side edges of the wafers, for instance by laser ablation, depositing a suitable material along the edges and/or in the space between the wafers to form a smooth, continuous surface in between adjacent wafers, for instance by use of ink-jet printing or mounting of prefabricated elements, or by coating both the rear surface of the cells and the gaps in between the cells with a polymer material, preferably with a polymer material having a high optical reflectance, having a smoothing effect to surface steps, and deposited for instance by using spin coating, spray coating, roller coating or ink-jet deposition. The removal of the back edges, or filling of material in the gaps between the adjacent wafers, should advantageously result in an angle between the wafer side walls and the transparent substrate of less than 70 degrees, preferably in the range from 30 to 60 degrees. In case of using deposited material, this may be obtained by either by use of ink-jet printing, or by pressing the wafers against the glue on the transparent substrate with a pressure adjusted to obtain glue being squeezed into the spacing between subsequent wafers. The glue should preferably fill up the vertical surface step between the wafer and the transparent substrate by more than 50%, preferably more than 70%, and the contact angle between the glue and wafer edge surfaces should be less than 70 degrees, preferably in the range 30 to 50 degrees.

The term "p-doped region" means a surface area of the wafer where a doping material resulting in an increased number of positive charge carriers is added into the semiconductor matrix within a certain distance below the surface forming a region of the wafer with a surface layer with p-type doping. The term "n-doped region" means a surface area of the wafer where a doping material resulting in increased number of negative charge carriers (mobile electrons) is added into the semiconductor matrix within a certain distance below the surface forming a region of the wafer with a surface layer with n-type doping. The thickness of the doped layers is usually of the order of a few tens of nm up to one µm, but this should not be considered as a limitation of the invention. All known and conceivable thicknesses of doped regions may be applied. Also, any type of known and conceivable doping element may be applied. The doping of the wafers may be obtained by in-diffusion of doping elements or alternatively by depositing thin layers (on the order of 10 nm) of amorphous silicon that has been doped either n-type or p-type. These thin doped layers form a hetero junction contact to the silicon that has electrical properties similar to what is obtained by adding doping material directly into the semiconductor matrix.

The deposition of the metal layer(s) forming the back side metallization may be obtained by vapour deposition techniques, evaporation, sputtering etc. of a metallic phase onto the entire back side of the front glass with the semi-finished solar cells attached. Suitable metals for vapour deposition include nickel, palladium, titanium, silver, gold, aluminium, copper, tungsten, vanadium, chromium, or any combination of these metals. The thickness of the deposited metal layer, or stacked system of metal layers, should advantageously have a total thickness in the range from 0.1 to 20 µm, preferably from 0.1 to 2 µm in the case of narrow cells (width ranging from 5-50 mm) and preferably from 5 to 20 µm in case of using cells with widths from 150 mm or more. Other possible techniques for depositing the metal layer(s) on an entire module in one operation are electroless or electro plating. Suitable metals for plating include nickel, palladium, silver, gold, copper, chromium, tin, or any combination of these materials. The invention is not restricted to these choices of metals, it may apply using any material that provides a good electric contact with the underlying semiconductor and which is resistant towards UV-light and any other disruptive force/physical condition associated with normal use of solar panels during the expected lifetime of a solar panel and of subsequent manufacturing steps after formation of the contacts. This may include known electric conducting plastics and/or other polymer formulations such as carbon polymers, etc.

The invention may apply any process for metal deposition and patterning as long as the front glass may withstand the temperatures and chemical environment involved. Possible process sequences for the metal deposition and patterning on the module level front glass may be (but are not limited to):

Evaporation or sputter deposition of a metal stack, total thickness in the range 0.1-20 µm, followed by deposition of masking material for metal wet etching process. The metal etching mask could either be polymer material (deposited by spray, spin, or roller coating) or silicon oxide (deposited by chemical vapour deposition or evaporation). The etching mask patterning could be by laser ablation, ink-jet etching of the mask, or ink jet deposition of an additional patterned polymer layer, followed in each case by metal etching by wet process,
   Alternatively, a thin metal seed layer can be deposited by evaporation or sputtering and patterned by the same methods above, followed by plating to a thickness of 1-20 µm,
   Alternatively, a thin metal seed layer can be deposited by evaporation or sputtering and patterned by direct laser scribing, followed by plating to a thickness of 1-20 µm,
   Alternatively, the metal layer can be patterned by a lift-off process as follows; i) deposit polymer film (by spray/spin/roller coating or as pre-fabricated film), ii) pattern by laser ablation, iii) deposit metal layer by sputter deposition or evaporation, and finally iv) remove metal between contacts by lifting off the polymer film, either by dissolving the polymer material in a chemical solvent or by physically ripping or peeling off the film. The metal layer attached to the polymer film can eventually be recycled.
   Metal annealing. An annealing process can be used to improve the metal contact to the underlying semiconductor and the conductivity of the metal itself, but has to be sufficiently short and not too hot in order to avoid damaging other elements in the structure, including any glue used to attach the cells to the front glass.

The pattern for etching of the metal layer is selected such that two distinct contact regions for each solar cell and interconnects between the cells appear on the metallic layer after the etching, one terminal for the for the p-type doped regions and one for the n-type doped regions. The chemical etching agent should be able to selectively etch the metallic phase, in order to avoid destroying the underlying passivation and/or reflectance layer(s) or the front glass. Any acid or alkaline etching agent known to dissolve the metallic phase may be applied, but not the underlying passivation and/or reflectance layer(s) or the front glass may be employed as an etching agent.

One option for the invention is to split each wafer into a number of individual regions or cells by forming a number of trenches in the wafers reaching into the wafers from about 70% to 100% of their thickness, for instance by use of a laser scribing, chemical etching, plasma etching, or reactive ion etching. Typical width of the narrow cells would be in the range from 5-50 mm. For the case of narrow cells, the metal layer(s) thickness would be significantly reduced compared to the wider cell alternative. Typical metal layer(s) thickness for the case of narrow cells would be in the range 0.1 to 2 µm, depending on actual cell width. With such thin metal layers, the preferred patterning techniques are by direct laser ablation, or by deposition of a polymer mask using ink-jet followed by chemical etching. Regions may be formed by use of laser scribing forming trenches reaching from about 70 to 100% of the thickness of the wafer.

LIST OF FIGURES

FIG. 1 shows an example of back-contacted solar cell according to prior art.

FIG. 2 shows an example of how to cut a Cz-ingot to form donor substrates for forming rectangular wafers.

FIG. 3 shows a schematic drawing of how to cut a cylindrical Cz-ingot for pseudo squaring as seen from the top of the ingot in pulling direction.

FIG. 4 shows a schematic drawing of how to cut a semi-squared Cz-ingot into donor substrates.

FIG. 5 shows a side view of a section of an example embodiment of a solar panel according to the invention.

FIG. 6 shows an example of planarizing method of the gap between adjacent wafers according to the invention.

FIG. 7 shows another example of planarizing method of the gap between adjacent wafers according to the invention.

EXAMPLE OF AN EMBODIMENT OF THE INVENTION

The invention will now be described in greater detail by way of an example of an embodiment of the invention. This example should not be interpreted as a limitation of the general idea of combining the contacting and interconnecting of the solar cells for the entire module in one process step.

The example embodiment of the invention employs monocrystalline silicon wafers cut out from rectangular monocrystalline donor-substrates made by Czochralski (Cz)-grown ingots that are cut into thick donor substrates as shown in FIGS. 2a) and 2b). Each donor wafer is edge trimmed and planarized after cutting to form evenly sized and rectangularly shaped thick donor substrates. These give an advantage in that two or more donor substrates may be processed simultaneously for formation of monocrystalline silicon wafers with similar dimensions and even rectangular shapes. Thus the formed wafers may be laid adjacent to each other in a regular pattern on the front glass with a consistent narrow gap between the wafers that allows formation of metal interconnects by depositing and patterning a metal layer. Typical donor substrate thickness could be in the range from 1 mm to 100 mm.

As may be seen from FIG. 2a), the centre part of the monocrystalline ingot, which is marked by reference numeral 1, is cut in its longitudinal direction to form a rectangularly shaped donor substrate marked by reference numeral 2. By the term "rectangularly shaped donor substrate" we mean a continuous piece of semiconductor (in this case monocrystalline silicon) with a shape as close as practically achievable to a rectangular parallelepiped with length a, width b and height c. By "evenly sized", we mean that length a, width b and height c of each substrate are as close as practically achievable equal for all donor substrates. Typical dimensions of Cz-grown monocrystalline ingots are cylinders with diameter in the range from 150 mm to 300 mm and length from 50 cm to more than 1 m. When using large Cz-grown ingots and cutting of longitudinal slices from the mid-section of the cylinder as shown in FIG. 2b), it is possible to cut out a number of rectangularly shaped donor substrates which after trimming have a length ranging from 15 to 100 cm, a width ranging from 15 to 30 cm and a height ranging from 1 mm to 10 cm. Alternatively, instead of sawing in the longitudinal direction, the thick donor substrates can be shaped from the squared or pseudo-squared Cz-ingot by sawing in the plane perpendicular to the pulling direction, see FIGS. 3 and 4, creating typical donor substrate area dimensions ranging from 10 by 10 $cm^2$ to 30 by 30 $cm^2$ and thickness 1 mm to 10 cm.

As an alternative to monocrystalline wafers, it is envisioned cheaper solar panels could be based on wafers made from multicrystalline silicon ingots, typically (but not necessarily) formed by the Bridgeman method. These may have dimensions up to 70×70×30 $cm^3$. From these ingots, it is possible to obtain substantially square multicrystalline donor substrates where the sides have lengths up to 65 cm and a thickness typically in the range from 0.1 to 5 cm. By substantially square, we mean as close to a square shape as practically obtainable.

There are known at least two methods for obtaining silicon wafers from a silicon donor substrate, where the formed wafer has the same crystal ordering as the donor substrate and where the wafer are formed onto and then separated from the donor substrate and transferred to a holding substrate. Both methods may be employed, but other methods may also be applied as long as they allow forming more or less planar wafers of semiconductor material with thickness ranging from 20 to 150 μm on a donor substrate followed by separation of the formed wafer from the donor substrate.

One of the known methods is based on forming a porous layer on the surface of the donor substrate followed by an epitaxial growth of the silicon wafer on top of the porous layer. The epitaxial growth process will form a homogeneous and continuous wafer on top of the porous layer (i.e. not porous) with the same crystal ordering as the donor. The underlying porous layer is mechanically weaker than the grown wafer, such that it is possible to separate the wafer from the donor by use of mechanical shear stress, ultrasound, laser heating etc. By this technology, the donor substrate is reduced by a few 10 nm to a few μm for each wafer lift-off, and thus reused many times. Typical donor substrate thickness for this technology will be in the range 1 to 5 mm. An example of such technology is described in U.S. Pat. No. 7,148,119.

The other method employs ion-implantation of hydrogen ions (protons) a certain distance into the donor substrate, thus forming a buried high-stress layer. This stressed layer may be further weakened by heating the donor substrate such that the protons form hydrogen atoms that weaken the silicon bonds, and thus allows a wafer to be lifted off in a controlled cleaving process. An example of such technology is disclosed in U.S. Pat. No. 6,890,838. The penetration distance of the protons is controlled and adjustable up to about 180 μm in the case of a silicon donor substrate by regulating the energy of the proton beam. Thus this technique may be employed to form wafers with thickness in the range from 20 to 150 μm. The silicon material employed for formation of the ingots and donor substrates may advantageously be a pre-doped material. Typical donor substrate thickness for this technology will be in the range 10 to 100 mm.

After formation of a semiconductor wafer on the donor substrate, the wafer could be transferred to a holding substrate for processing or processed individually by in-line processes on a free-standing basis to semi-finished solar cells made ready for back side metallization. Transferring the wafer to a holding substrate depends on actual wafer thickness. Alternatively, some or all of the processing to semi-finished solar cells made ready for back side metallization could be done on the wafer before separation from the donor substrate. As mentioned, this processing may be by any conceivable or known process to a skilled person, and nor is there any limitation in which passivation films, anti-reflecting coating, or forming of doped regions in the semiconductor wafer, that is being used. Thus there is no need of a detailed description of the processing up to the semi-finished state.

Also, even though the examples described here are based on wafers onto donor substrates and then separated from the donor, the invention may of course apply conventional wafers sawn out from CZ-ingots or polycrystalline ingots/blocks.

The solar cells according to this embodiment may have an optional front surface layer that is n-doped. The substrate doping can be either type. On the back side of the semiconductor wafer, there is formed an interdigitated pattern of n+ and p+ doped regions. Both sides of the wafer surface passivated by one or more layers chosen from: A layer of hydrogenated amorphous silicon, hydrogenated amorphous silicon nitride, or silicon oxide. The passivation layers have thickness in the range from 1 to 200 nm. The surface Passivation layer on the front side also serves as anti-reflect coating layer. The amorphous silicon layer can be alloyed with amorphous silicon carbide, and/or may be capped with a layer of amorphous silicon nitride.

The formation of the monocrystalline silicon wafers with doped regions and the front passivation films are included in the procedure for forming semi-finished wafers made ready for back side metallization. All these process steps may be performed when the wafers are attached to the holding substrate. The formation of the front layer with n-type in-diffused dopants may be obtained by employing an n-doped holding substrate and heating the substrate and wafer. Alternatively, if the wafer has sufficient thickness/mechanical robustness, all these process steps may be performed on a free standing form (not intermediately connected to any substrate). The two alternative technologies for creating the wafer will probably be somewhat different in the preferred processing used for creating the semi-finished cell before transferring and attaching it to the front glass.

The next step is transferring the semi-finished wafers and attaching them with a surface-passivated side facing down onto the front glass, side by side in a regular pattern such that there is formed narrow and even gaps between the solar cells in the order 0.1 to 2 mm. Following the attachment onto the front glass, the semi-finished wafers may be split into a number of narrow solar cells. This is motivated by the possibility of increasing the solar module output voltage and reduced metal layer thickness. Splitting the wafer into narrow cells may de done by laser scribing. Alternatively, wafer splitting is done by laser chemical etching, wet silicon etching, plasma etching or reactive ion etching.

Thereafter, the entire front glass with attached wafers of semi-processed cells is transferred to a PECVD-chamber for deposition of suitable passivation layers. In addition to the surface passivation layer, a polymer coating can be deposited in order to smooth the surface steps, and to enhance the back-surface internal reflection characteristics of the cell. The polymer coating should have white colour in order to have good optical capability to enhance the back-surface internal reflection. The white polymer coating may be deposited and patterned by ink-jet deposition. The patterned white polymer may be acting as etching mask for etching the contact holes in the underlying surface passivation layer, to allow electric contact between the doped regions of the semiconductor film and the metal layer that is to be deposited.

Additionally, in a subsequent process prior to deposition of the metal, the surface steps of the gap zones may be smoothed and planarized by i) removing the edge of the silicon wafer, for instance by laser grinding, ii) depositing material on the side-wall of the wafer, for instance by depositing material with a nozzle (inkjet) or a pre-formed material, or iii) filling up the whole gap between wafers with a suitable material, polymer, glass, epoxy, etc.

Immediately prior to metal deposition, the exposed semiconductor doped regions should be cleaned of debris and surface oxide by chemical or plasma etching.

The metal layer deposition may be obtained by sputter deposition of aluminium. After deposition of the metal layer, the metal layer is partitioned by local selective etching to form a metallic pattern that forms the electric contacts on each cell and interconnects between adjacent cells of the solar panel/module. Metal patterning is obtained by ink-jet deposition of a patterned etching mask followed by metal etching.

The electrical contact between metal and silicon is completed by a contact annealing process, which has to be short and not too hot in order to avoid damaging the structure, including any glue used to attach the wafers to the front glass, and the front glass itself.

The metal-to-silicon contact annealing process depends on actual metal system and the resistivity of silicon contact area. Typical contact annealing process has a temperature range 200-300° C. and duration from a few minutes to 30 minutes.

At this point, the solar cells are processed to a functional state, such that the solar panel/module may be made ready by mounting the front glass into the load carrying frame.

A side-view of a section of the solar panel according to one example embodiment of the invention is shown in FIG. 5. The panel shown on the figure may be formed as follows:

A set of silicon monocrystalline wafers with thickness in the range 50 to 100 made on CZ-grown donor substrates are pre-processed such that each wafers obtains an interdigitated pattern of n-doped 101 and p-doped 102 zones and one or more deposited dielectric surface passivation films 103 on the front side. Then the wafers are laid with their front side (the surface with the deposited passivation layer(s) and optionally also an anti-reflective film) side by side on the front glass and attached by use of a layer of glue.

When the pre-processed wafers have been attached to the front glass, they are divided into several narrow regions (cells) of about 10 mm width by use of laser ablation. The laser ablation is also used to remove a portion of the back edges of the wafers such that the wafers seen from the side becomes shaped like an isosceles trapezoid (trapezium with congruent angles). The angle is approximately 70°.

FIG. 5 shows two such narrow edge trimmed regions of the wafer 100 which are attached to the front glass 104 by a layer of glue 105. The interdigitated pattern of n- and p-doped doped regions are seen as shaded area 101 and 102, respectively. The laser ablation results in trenches 108.

When the wafers are divided into narrow regions, the entire back side of the front glass including attached wafers are transferred to a PECVD-chamber and given a similar surface passivation layer(s) 103a as the front side of the wafers. Then a reflective polymer coating 107 is laid by a patterned ink-jet deposition onto the back-side surface passivation layer(s) 103a above and aligned to the n- and p-doped region 101, 102. The next step is local removal of the back-side passivation layer(s) 103a. This is obtained by using a chemical etching agent which works selectively on the passivation layer(s) 103a, were the patterned polymer coating 107 is acting as an etching mask.

When the contact openings are formed, the entire back side of the front glass including attached wafers is given a layer of aluminium 106 by vapour deposition. The aluminium layer is about 1 μm thick. Finally, the back side of the front glass is finished by local etching of the deposited aluminium layer 106 at regions 109 such that the adjacent narrow regions of the wafer 100 become serially connected to each other.

FIG. 6 shows a similar panel as in FIG. 5, but now at the stage after edge rimming of the wafers 100. In this case the edge trimming is obtained by depositing a material 110 filling the gap between adjacent wafers. FIG. 7 illustrates a similar situation, but now the edge trimming is obtained by squeezing the wafers into the glue layer 105 such that the glue partially penetrates into the area 108 between the wafers.

After completing the metal contact and interconnection process on the back-side of the front glass, the front glass continues into a standard module process were the cells and interconnections on the back-side are sealed/protected from the environment by ethylene vinylacetate copolymer (EVA) and protective back-sheet (for instance Tedlar or glass) in a lamination process at elevated temperature in vacuum. Finally, the laminated module sandwich can be mechanically strengthened y a metal frame and electrically connected/protected by a diode junction box.

The invention claimed is:

1. Solar panel/module comprising:
   a transparent front glass,
   a number of semiconductor wafers which each are processed to form semi-finished solar cells, and which are attached adjacent to each other onto a back side of the transparent front glass, and
   electric contacts of the semi-finished solar cells and interconnects connecting adjacent semi-finished solar cells of the solar panel/module,
   where the electric contacts of the semi-finished solar cells and the interconnects connecting adjacent semi-finished solar cells of the solar panel/module are formed by one patterned layer covering the back side of the transparent front glass including a back side of the attached semi-finished solar cells.

2. Solar panel/module according to claim 1 wherein the semiconductor wafers are made of one of either Si, Ge, InP, or GaAs.

3. Solar panel/module according to claim 2, wherein the semiconductor wafers are made of monocrystalline Si of thickness of 150 µm or less, and which are laid adjacent to each other with a gap between adjacent semiconductor wafers on the range from 0.1 to 2 mm.

4. Solar panel/module according to claim 3, wherein the semiconductor wafers have a thickness from 20 to 80 µm.

5. Solar panel/module according to claim 1, wherein the patterned layer is a metal layer made of one or more of nickel, palladium, titanium, silver, gold, aluminum, copper, tungsten, chromium, vanadium, tin, or any combination of these materials.

6. Solar panel/module according to claim 1, wherein the patterned layer comprises one of: a metal layer, electric conducting plastics, and carbon polymers.

7. Solar panel/module according to claim 1, wherein a gap between the semiconductor wafers attached adjacent to each other on the transparent front glass is filled with polymer, glass, or epoxy.

* * * * *